US010126698B2

United States Patent

(12) United States Patent
Sato et al.

(10) Patent No.: US 10,126,698 B2
(45) Date of Patent: Nov. 13, 2018

(54) IMAGE FORMING APPARATUS

(71) Applicant: Brother Kogyo Kabushiki Kaisha, Nagoya-shi, Aichi-ken (JP)

(72) Inventors: Shougo Sato, Seto (JP); Masahito Saeki, Nagoya (JP)

(73) Assignee: Brother Kogyo Kabushiki Kaisha, Nagoya-shi, Aichi-ken (JP)

( * ) Notice: Subject to any disclaimer, the term of this patent is extended or adjusted under 35 U.S.C. 154(b) by 0 days.

(21) Appl. No.: 15/651,144

(22) Filed: Jul. 17, 2017

(65) Prior Publication Data

US 2018/0004145 A1 Jan. 4, 2018

Related U.S. Application Data

(63) Continuation of application No. 15/433,212, filed on Feb. 15, 2017, now Pat. No. 9,709,943, which is a (Continued)

(30) Foreign Application Priority Data

Mar. 28, 2014 (JP) ................................ 2014-069736

(51) Int. Cl.

*G03G 15/00* (2006.01)
*B65H 1/04* (2006.01)
(Continued)

(52) U.S. Cl.

CPC ........... *G03G 15/6552* (2013.01); *B65H 1/04* (2013.01); *B65H 5/06* (2013.01); *B65H 29/12* (2013.01); *B65H 29/125* (2013.01); *B65H 29/14* (2013.01); *B65H 31/02* (2013.01); *G03G 15/6529* (2013.01); *G03G 21/1609* (2013.01); *H05K 999/99* (2013.01); *B65H 2301/3122* (2013.01); *B65H 2301/4212* (2013.01);
(Continued)

(58) Field of Classification Search

CPC .................................................. G03G 15/6552
USPC ......................................................... 399/405
See application file for complete search history.

(56) References Cited

U.S. PATENT DOCUMENTS 4,657,372 A 4/1987 Ikeda et al.
5,260,759 A 11/1993 Kobayashi
(Continued)

FOREIGN PATENT DOCUMENTS

JP S61-279870 A 12/1986
JP 2007-226269 A 9/2007
JP 2011-065069 A 3/2011

*Primary Examiner* — Anthony Nguyen

(74) *Attorney, Agent, or Firm* — Banner & Witcoff, Ltd.

(57) ABSTRACT

An image forming apparatus includes a photosensitive drum, a light exposure device, a developing device, a fixing unit disposed opposite to the light exposure device relative to the developing device, a sheet supply tray disposed below the developing device, an ejection tray disposed above the developing device and having a sheet receiving surface inclined downward, relative to a horizontal direction, toward the charger, and a sheet conveying path through which a sheet is conveyed from the sheet supply tray to the ejection tray. A lowest end portion of the sheet receiving surface is disposed below an upper end of the charger in the vertical direction. The charger is disposed opposite to the developing device relative to the lowest end portion of the sheet receiving surface.

10 Claims, 9 Drawing Sheets

Related U.S. Application Data continuation of application No. 15/134,798, filed on Apr. 21, 2016, now Pat. No. 9,575,452, which is a continuation of application No. 14/667,339, filed on Mar. 24, 2015, now Pat. No. 9,323,206.

(51) Int. Cl.

| | |
|---|---|
| ***B65H 5/06*** | (2006.01) |
| ***G03G 21/16*** | (2006.01) |
| ***B65H 29/12*** | (2006.01) |
| ***B65H 29/14*** | (2006.01) |
| ***B65H 31/02*** | (2006.01) |

(52) U.S. Cl.

CPC ...... *B65H 2402/31* (2013.01); *B65H 2402/46* (2013.01); *B65H 2404/1421* (2013.01); *B65H 2405/114* (2013.01); *B65H 2405/115* (2013.01); *B65H 2405/1117* (2013.01); *B65H 2601/11* (2013.01); *B65H 2801/06* (2013.01)

(56) References Cited

U.S. PATENT DOCUMENTS

| | | | | |
|---|---|---|---|---|
| 5,343,223 | A * | 8/1994 | Tohyama | G03G 15/65 347/134 |
| 5,414,492 | A | 5/1995 | Kubota | |
| 5,828,929 | A | 10/1998 | Watanabe et al. | |
| 6,173,145 | B1 | 1/2001 | Chadani et al. | |
| 6,272,297 | B1 * | 8/2001 | Kobayashi | G03G 15/50 271/298 |
| 6,272,300 | B1 | 8/2001 | Fujiwara et al. | |
| 6,304,733 | B1 * | 10/2001 | Ohira | G03G 15/6582 399/405 |
| 6,314,267 | B1 * | 11/2001 | Kida | G03G 15/231 399/405 |
| 8,382,095 | B2 | 2/2013 | Osanai et al. | |
| 8,752,825 | B2 | 6/2014 | Watanabe | |
| 2004/0190934 | A1 | 9/2004 | Okabe | |
| 2005/0036802 | A1 * | 2/2005 | Saito | G03G 15/6573 399/111 |
| 2005/0220479 | A1 | 10/2005 | Ito et al. | |
| 2006/0018692 | A1 | 1/2006 | Kubo | |
| 2006/0029418 | A1 | 2/2006 | Ishii et al. | |
| 2007/0160381 | A1 | 7/2007 | Sato et al. | |
| 2009/0060573 | A1 | 3/2009 | Ito | |
| 2009/0214279 | A1 | 8/2009 | Ito | |
| 2009/0226230 | A1 | 9/2009 | Ohkawa | |
| 2010/0021203 | A1 * | 1/2010 | Nishimura | G03G 21/1821 399/119 |
| 2010/0060956 | A1 | 3/2010 | Harada | |
| 2011/0069995 | A1 | 3/2011 | Sato | |
| 2011/0243607 | A1 * | 10/2011 | Takahashi | G03G 15/2014 399/122 |
| 2012/0070185 | A1 | 3/2012 | Yokota | |
| 2012/0313309 | A1 | 12/2012 | Yoshida | |
| 2014/0064779 | A1 | 3/2014 | Sato | |
| 2014/0270859 | A1 | 9/2014 | Hosokawa et al. | |

* cited by examiner

IMAGE FORMING APPARATUS

CROSS REFERENCE TO RELATED APPLICATION

This application is a continuation of U.S. patent application Ser. No. 15/433,212, filed Feb. 15, 2017, which is a continuation of U.S. patent application Ser. No. 15/134,798, filed Apr. 21, 2016 (now U.S. Pat. No. 9,575,452, issued Feb. 21, 2017), which is a continuation of U.S. patent application Ser. No. 14/667,339 filed Mar. 24, 2015 (now U.S. Pat. No. 9,323,206, issued Apr. 26, 2016), which claims priority from Japanese Patent Application No. 2014-069736, filed on Mar. 28, 2014. The entire subject matter of the above noted applications are hereby incorporated by reference.

TECHNICAL FIELD

Aspects of the disclosure relate to an image forming apparatus configured to form an image on a sheet.

BACKGROUND

A known image forming apparatus is made smaller in a vertical dimension by positioning a lower end portion of an ejection tray below an upper end of a fixing unit in a vertical direction.

SUMMARY

Illustrative aspects of the disclosure provide an image forming apparatus having a reduced vertical dimension.

According to an aspect of the disclosure, an image forming apparatus includes a photosensitive drum configured to carry a developer image to be transferred onto a sheet, a light exposure device configured to expose the photosensitive drum to light by scanning, a developing device configured to supply developer to the photosensitive drum exposed by the light exposure device, a charger disposed opposite to the light exposure device relative to the developing device and configured to charge the photosensitive drum, a fixing unit configured to fix the developer image transferred on the sheet, a sheet supply tray disposed below the developing device in a vertical direction and configured to receive sheets to be supplied to the photosensitive drum, an ejection tray configured to receive a sheet on which image formation is finished and disposed above the developing device in the vertical direction, and a sheet conveying mechanism having a sheet conveying path. The ejection tray has a sheet receiving surface provided on an upper surface of the ejection tray in the vertical direction, the sheet receiving surface being inclined downward, relative to a horizontal direction, toward the charger. The sheet conveying path includes a first U-shaped portion disposed downstream relative to the sheet supply tray in a sheet conveying direction in which a sheet is conveyed from the sheet supply tray toward the fixing unit, a second U-shaped portion disposed downstream relative to the fixing unit in the sheet conveying direction and above the first U-shaped portion in the vertical direction, and a connection portion connecting the first U-shaped portion and the second U-shaped portion. A lowest end portion of the sheet receiving surface is disposed below an upper end of the charger in the vertical direction. The charger is disposed opposite to the developing device relative to the lowest end portion of the sheet receiving surface.

With this structure, the need to increase the vertical dimension of the image forming apparatus can be reduced while the stacking capacity on the sheet receiving surface is maintained.

BRIEF DESCRIPTION OF THE DRAWINGS

Reference is made to the following description taken in connection with the accompanying drawings, like reference numerals being used for like corresponding parts in the various drawings.

DETAILED DESCRIPTION

Illustrative embodiments of the disclosure will be described with reference to the following drawings. In the following description, the embodiments of the disclosure are applied to a monochrome image forming apparatus.

In the following description, the expressions “front”, “rear”, “upper or top”, “lower or bottom”, “right”, and “left” are used to define the various parts when the image forming apparatus 1 is disposed in an orientation in which it is intended to be used.

For members or portions designated by numerals, at least one is provided unless “plural” or “two or more” is specifically stated otherwise.

A first illustrative embodiment will be described.

Figure 1:
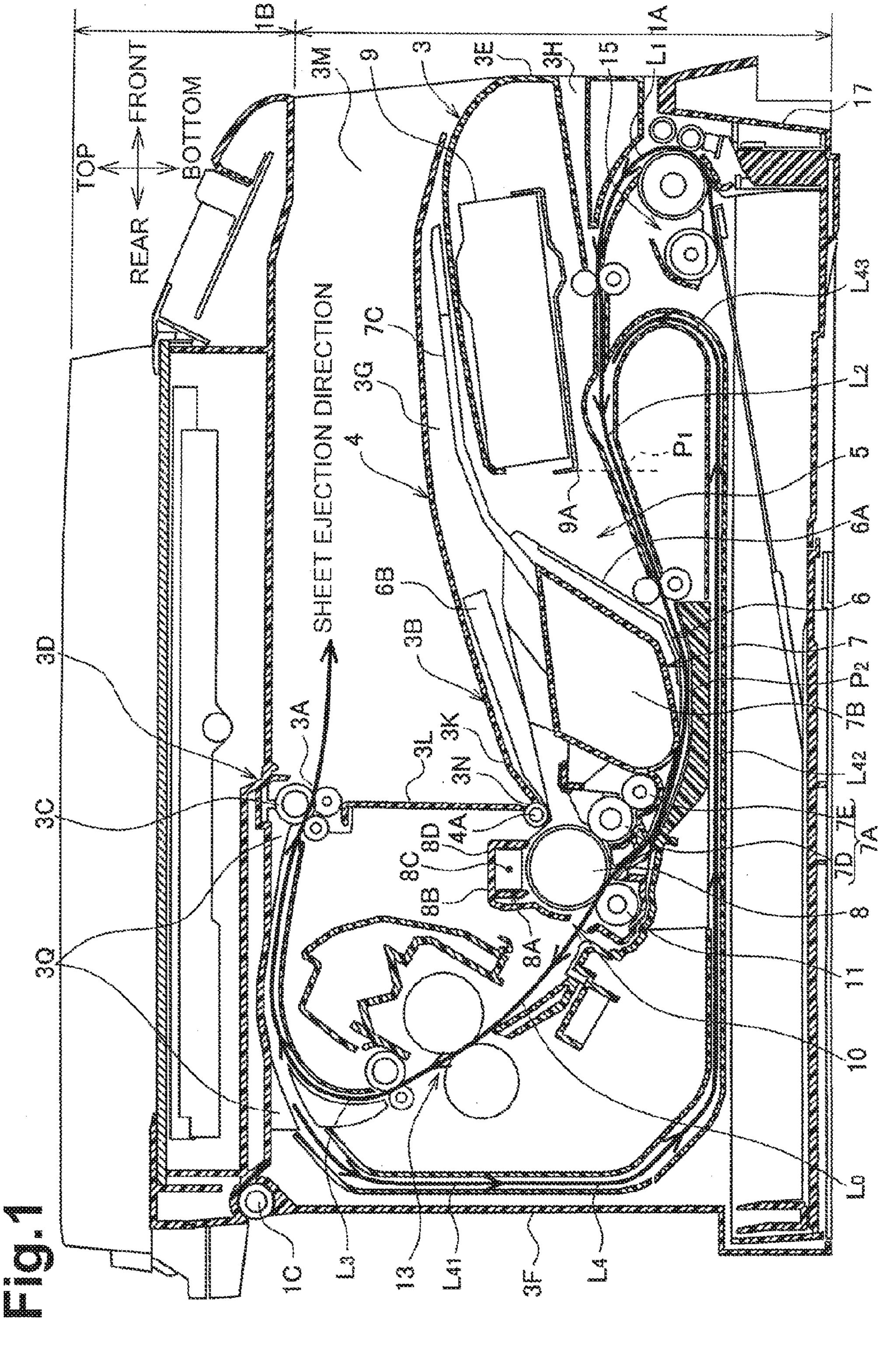
FIG. 1 is a sectional view of an image forming apparatus according to a first illustrative embodiment.

As illustrated in FIG. 1, an image forming apparatus 1 is a combination of a printer 1A and a scanner 1B. The printer 1A is a printing apparatus that forms an image on a recording medium, e.g., a sheet. The scanner 1B is an image reading apparatus that reads an image (including characters) on a document.

Figure 2:
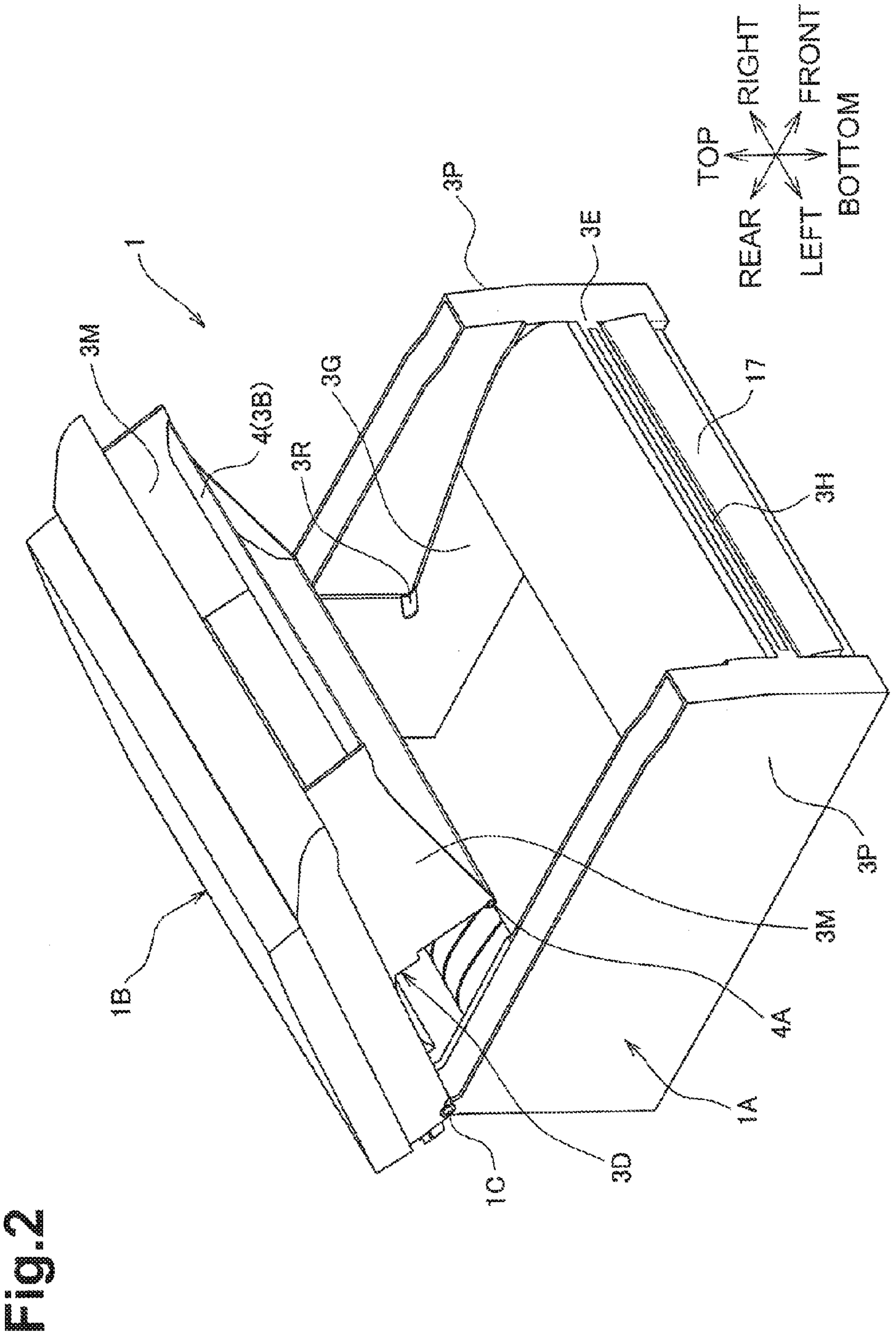
FIG. 2 is a perspective view of the image forming apparatus according to the first illustrative embodiment.

The scanner 1B is disposed above the printer 1 in a vertical direction. Below the scanner 1B in the vertical direction, an ejection tray 3B is disposed. The ejection tray 3B receives a sheet on which an image has been formed. As illustrated in FIG. 2, the scanner 1B is pivotably coupled to the printer 1A via a hinge portion 1C.

The hinge portion 1C is disposed to an upper portion of and a rear portion of the printer 1A.

A casing 3 of the printer 1A accommodates an image forming section 5 that forms an image on a sheet. An upper portion of the casing 3 in the vertical direction contains an ejection port 3A and an ejection tray 3B. A sheet having image formed thereon is ejected from the ejection port 3A toward the ejection tray 3B.

The ejection tray 3B includes a sheet receiving surface 3K, a vertical wall portion 3L, and left and right sidewall portions 3M. The sheet receiving surface 3K is a surface on which a sheet ejected from the ejection port 3A is received, and is provided to an upper surface of the ejection tray 3B in the vertical direction, facing the scanner 1B.

The sheet receiving surface 3K is inclined downward toward a charger 8A, which will be described later. In short, the sheet receiving surface 3K is inclined, relative to a horizontal direction and in a downward direction, from the front side to the rear side. The vertical wall portion 3L is a wall surface extending upward in the vertical direction from a lowest end portion 3N of the sheet receiving surface 3K and crossing a sheet ejection direction in which a sheet is ejected toward the sheet receiving surface 3K.

The left and right sidewall portions 3M are vertical wall surfaces provided on left and right ends of the sheet receiving surface 3K of the ejection tray 3B in a width direction, respectively. The left and right sidewall portions 3M are parallel to the sheet ejection direction (front-rear direction in the embodiment). The width direction is a horizontal direction (left-right direction in the embodiment) perpendicular to the sheet ejection direction.

An ejection roller 3C that feeds the sheet to the sheet receiving surface 3K is disposed at the ejection port 3A. The ejection port 3A and the ejection roller 3C are disposed upward in the vertical direction from the lowest end portion 3N of the sheet receiving surface 3K. The ejection roller 3C can change its rotation direction between two states; one state is for ejecting the sheet toward the ejection tray 3B; and the other state is for refeeding the sheet toward the image forming section 5 by reversing a sheet conveying direction.

The casing 3 includes a top cover 3D, left and right side covers 3P (FIG. 2), a front cover 3E, and a rear cover 3F. The top cover 3D covers at least an upper portion of the ejection roller 3C in the printer 1A and is combined into the scanner 1B.

Thus, as illustrated in FIG. 2, the top cover 3D pivots about the hinge portion 1C together with the scanner 1B. The hinge portion 1C is disposed upstream of the ejection roller 3C in the sheet conveying direction. In other words, the top cover 3D and the scanner 1B are pivotable about a portion disposed further to the rear than the ejection roller 3C.

The left and right side covers 3P cover the left and right surfaces of the printer 1A, respectively, constituting exterior design surfaces of the printer 1A. The front cover 3E covers the front surface of the printer 1A, constituting an exterior design surface of the printer 1A. The rear cover 3F covers a rear surface of the printer 1A, constituting an exterior design surface of the printer 1A.

The front cover 3E is provided with a manual sheet supply port 3H, which is an opening for directly supplying a sheet to be fed toward the image forming section 5, without use of a feeder mechanism 15, which will be described later. In short, when the user inserts a sheet in the manual sheet supply port 3H, the image forming section 5 performs image formation onto the inserted sheet.

An open/close cover 4 is movable between a closed position to close an opening 3G and an open position to open the openings 3G. The open/close cover 4 is pivotably coupled to the top cover 3D (the vertical wall portion 3L in the embodiment) via a hinge portion 4A around which the open/close cover 4 pivots. As illustrated in FIG. 1, the opening 3G is open at least above the developing device 7A in the vertical direction and covered by the open/close cover 4. The entire image forming unit 6 is exposed to the opening 3G.

An upper surface of the open/close cover 4 constitutes at least a part of the sheet receiving surface 3K. The hinge portion 4A is disposed on a portion of the ejection tray 3B (or the open/close cover 4) and in proximity to the lowest end portion 3N. As illustrated in FIG. 2, the vertical wall portion 3L and the left and right sidewall portions 3M are combined with the top cover 3D in one.

Thus, when the top cover 3D or the scanner 1B pivots about the hinge portion 1C in a direction away from the opening 3G, the vertical wall portion 3L and the left and right sidewall portions 3M also move together with the top cover 3D.

The left and right sidewall portions 3M are provided with engaging portions (not illustrated), each locking a corresponding one of left and right ends of the open/close cover 4 in the width direction. The engaging portions protrude such that they are caught on a lower surface of the open/close cover 4 in the vertical direction.

When the scanner 1B and the top cover 3D pivot about the hinge portion 1C in the direction away from the opening 3G, the open/close cover 4 is in the open position. When the scanner 1B and the top cover 3D pivot about the hinge portion 1C in a direction toward the opening 3G, the open/close cover 4 is in the closed position. In short, the open/close cover 4 pivots together with the top cover 3D.

The image forming section 5 is of electrophotographic type and configured to form a developer image on a sheet. As illustrated in FIG. 1, the image forming section 5 includes an image forming unit 6, a light exposure device 9, a transfer unit 11, and a fixing unit 13. The image forming unit 6 is detachably attachable relative to a main body through the opening 3G.

The main body refers to the casing 3 and frames (not illustrated), which cannot be disassembled by a user. The frames are plate-like strength members disposed on both sides of the image forming section 5 in a horizontal direction. Components constituting the image forming section 5 are assembled to the frames.

The image forming unit 6 is a combination of a storing unit 7 and a drum unit 10 via a support body 6A. The storing unit 7 is detachably attached to the support body 6A. The drum unit 10 is undetachable from the support body 6A and combined into the support body 6A.

The storing unit 7 includes a developing device 7A and a storing portion 7B. The developing device 7A supplies developer stored in the storing portion 7B to the photosensitive drum 8. The developing device 7A includes a developing roller 7D and a supply roller 7E. The drum unit 10 includes the photosensitive drum 8 and a charger 8A.

In short, the image forming unit 6 includes the photosensitive drum 8, the charger 8A, the developing device 7A and the storing portion 7B. Thus, when the top cover 3D pivots in the direction away from the opening 3G and is located in the open position, the image forming unit 6 is detachably attachable relative to the main body, and the storing unit 7 is detachably attachable relative to the support body 6A (the image forming unit 6) and the drum unit 10.

The photosensitive drum 8 is a photosensitive member that carries a developer image thereon. The charger 8A charges a surface of the photosensitive drum 8. The light exposure device 9 exposes the charged surface of the photosensitive drum 8 to light. Thus, an electrostatic latent image is formed on the surface of the photosensitive drum 8. The light exposure device 9 according to the embodiment exposes the surface of the photosensitive drum 8 while scanning a beam.

When developer is supplied to the photosensitive drum 8 on which the electrostatic latent image is formed, a developer image is formed on the photosensitive drum 8. The transfer unit 11 is disposed facing the photosensitive drum 8. The transfer unit 11 transfers the developer image carried on the photosensitive drum 8 to a sheet.

The fixing unit 13 directly or indirectly applies heat to the developer image transferred onto the sheet and fixes the developer image on the sheet by heat. The sheet ejected from the fixing unit 13 is guided by a guide portion 3Q, which is combined into the top cover 3D, toward the ejection roller 3C.

The lowest end portion 3N of the sheet receiving surface 3K is located below an upper end 8B of the charger 8A in the vertical direction and the charger 8A is disposed opposite to the developing device 7 relative to the lowest end portion 3N of the sheet receiving surface 3K. The upper end 8B of the charger 8A is a top end of an electrode member 8D surrounding a charging wire 8C.

The storing unit 7 includes a first grip portion 7C. The first grip portion 7C is a portion gripped by the user when the storing unit 7 is removed or attached. When the storing unit 7 is attached to the drum unit 10 (the support body 6A) and the drum unit 10 is attached to the main body, the first grip portion 7C is disposed above the light exposure device 9 in the vertical direction.

Figure 3:
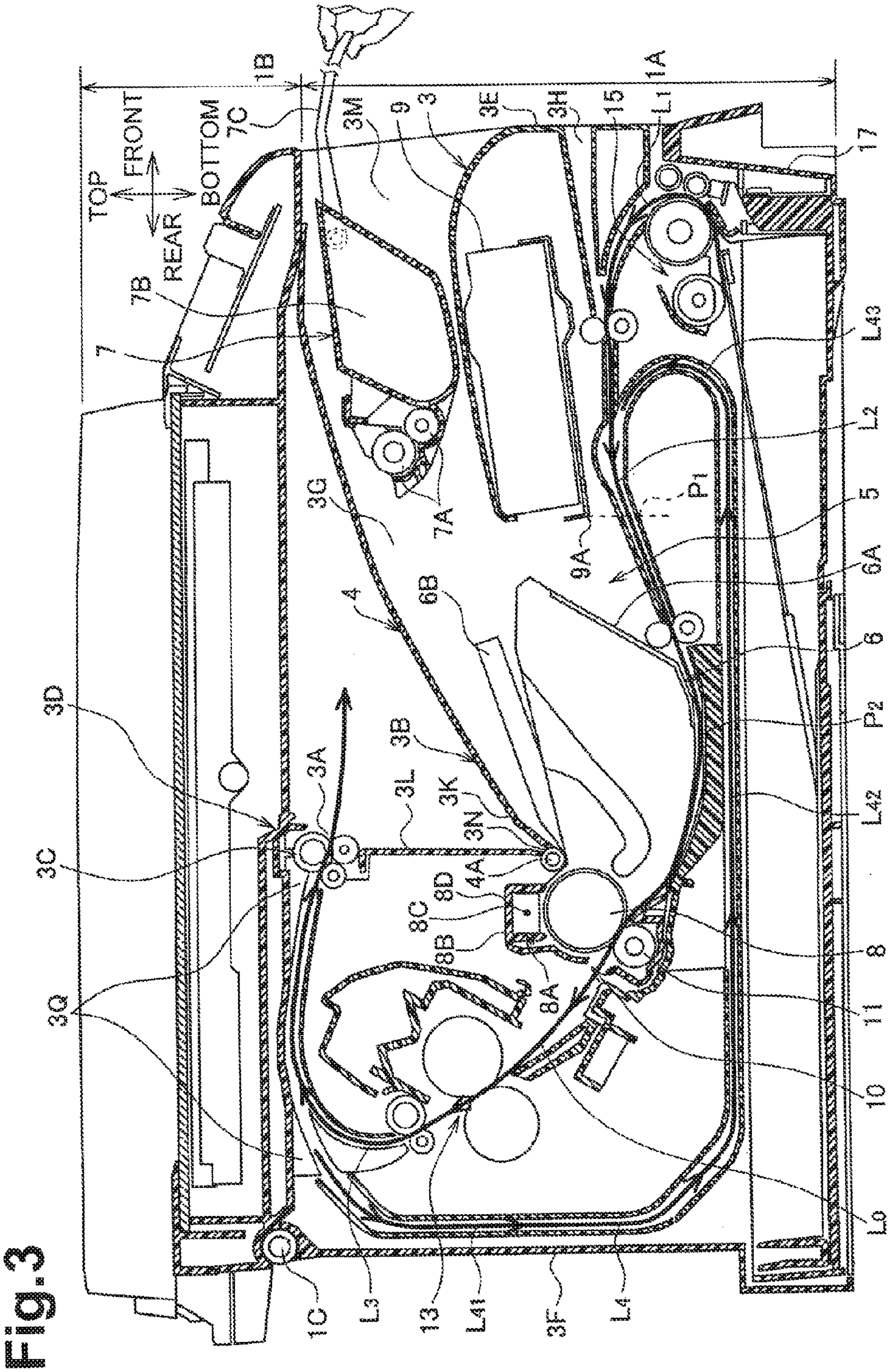
FIG. 3 is a sectional view of the image forming apparatus according to the first illustrative embodiment.

The open/close cover 4 is movably coupled to the top cover 3D via the hinge portion 4A. As illustrated in FIG. 3, when the storing unit 7 is pulled frontward by the user holding and pulling the first grip portion 7C frontward with the open/close cover 4 slightly open, the open/close cover 4 is widely opened, and the opening 3G is released.

As illustrated in FIG. 1, the support body 6A of the image forming unit 6 (including the drum unit 10) includes a second grip portion 6B. The second grip portion 6B is a portion gripped by the user when the image forming unit 6 including the drum unit 10 is removed or attached.

Figure 4:
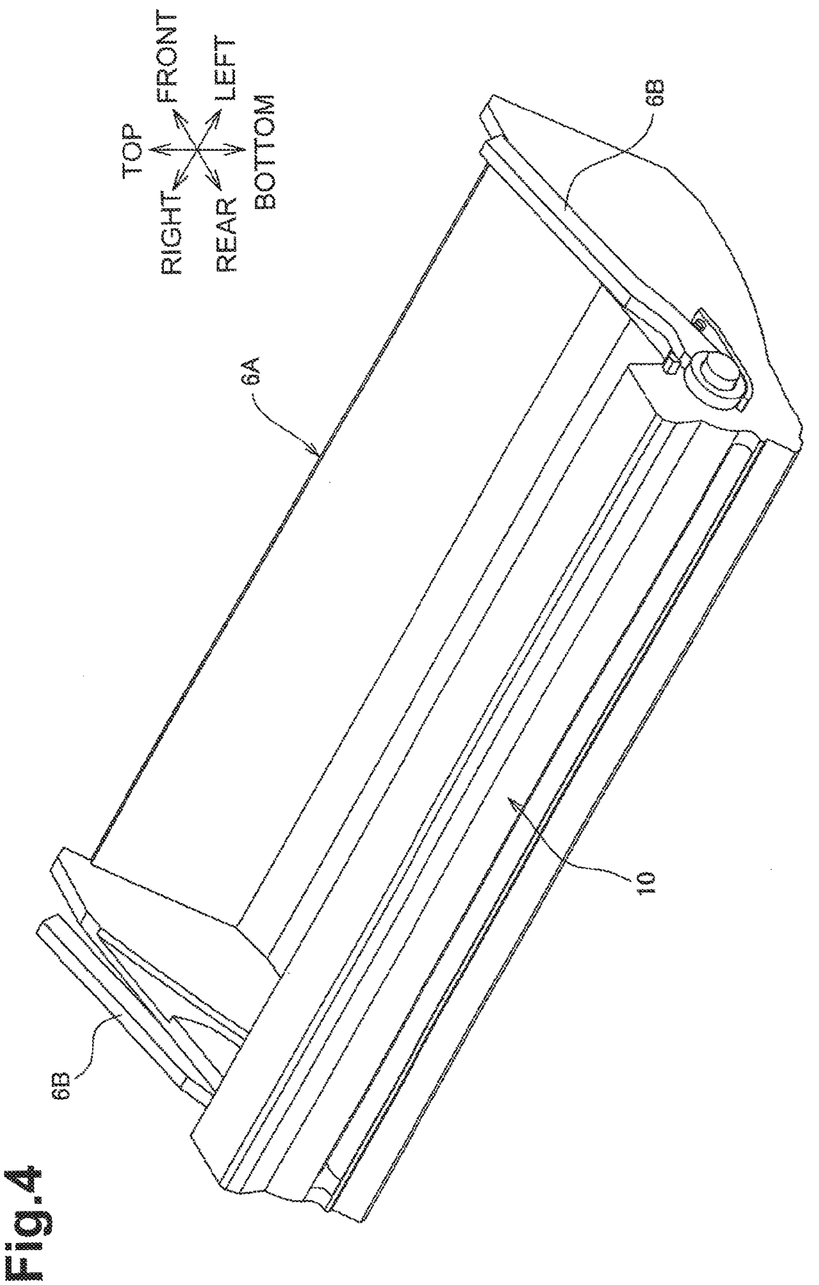
FIG. 4 is a perspective view of a support body according to the first illustrative embodiment.
Figure 5A:
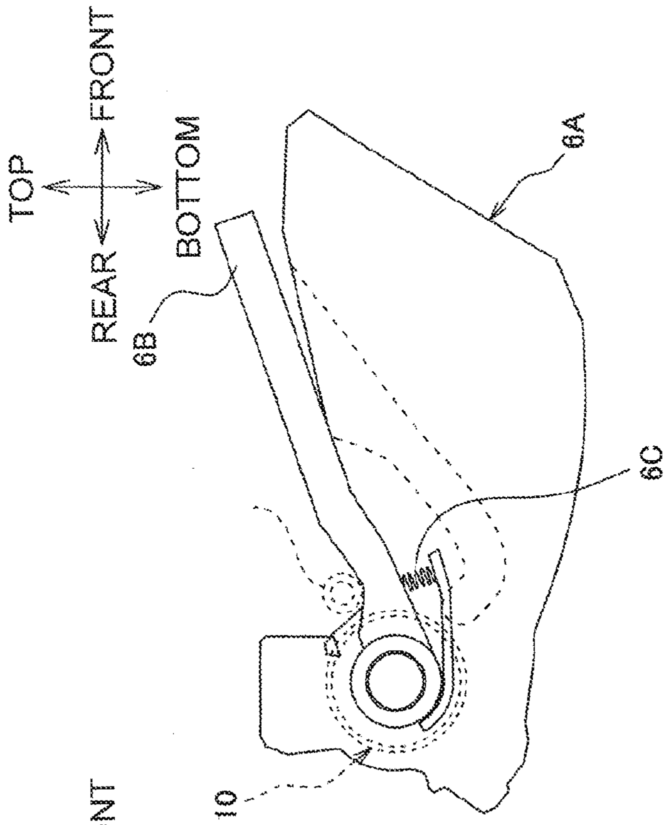
FIG. 5A illustrates the support body according to the first illustrative embodiment.

As illustrated in FIG. 4, the support body 6A includes left and right second grip portions 6B each shaped like a lever. The left and right second grip portions are disposed on the left and right side surfaces of the support body 6A in the width direction. Each of the second grip portions 6B has one end and the other end in a longitudinal direction. One end of each second grip portion 6B is assembled to the support body 6A such that each second grip portion 6B pivots between a state (illustrated in FIG. 5A) in which the other end is close to the support body 6A and a state (illustrated in FIG. 5B) in which the other end is away from the support body 6A.

An elastic member 6C exerts an elastic force to move the second grip portion 6B to a position (FIG. 5B) in which the other end of the second grip portion 6B is separated from the support body 6A. When the support body 6A or the image forming unit 6 (including the drum unit 10) is attached to the main body, as illustrated in FIG. 1, each second grip portion 6B is pressed by the vertical wall portion 3L of the top cover 3D, and brought close to the support body 6A. In other words, the support body 6A or the image forming unit 6 has a recessed portion configured to, when attached to the main body, receive an end of the vertical wall portion 3L of the top cover 3D, which is the lowest end portion 3N of the sheet receiving surface 3K. The recessed portion is disposed below the upper end of the charger 8A in the vertical direction and in proximity to the photosensitive drum 8.

In short, the vertical wall portion 3L presses the second grip portions 6B by means of gravity acting on the top cover 3D and the scanner 1B. Thus, when the top cover 3D and the scanner 1B moves in the direction away from the opening 3G, as illustrated in FIG. 6, the opening 3G is released, the force pressing the second grip portions 6B disappears, and the second grip portions 6B are spaced apart from the support body 6A.

Thus, the user can attach or remove the image forming unit 6 (including the drum unit 10) through the opening 3G relative to the main body by gripping the second grip portions 6B. With the top cover 3D and the scanner 1B moved in the direction away from the opening 3G, only the storing unit 7 can be attached to or removed from the main body.

Figure 6:
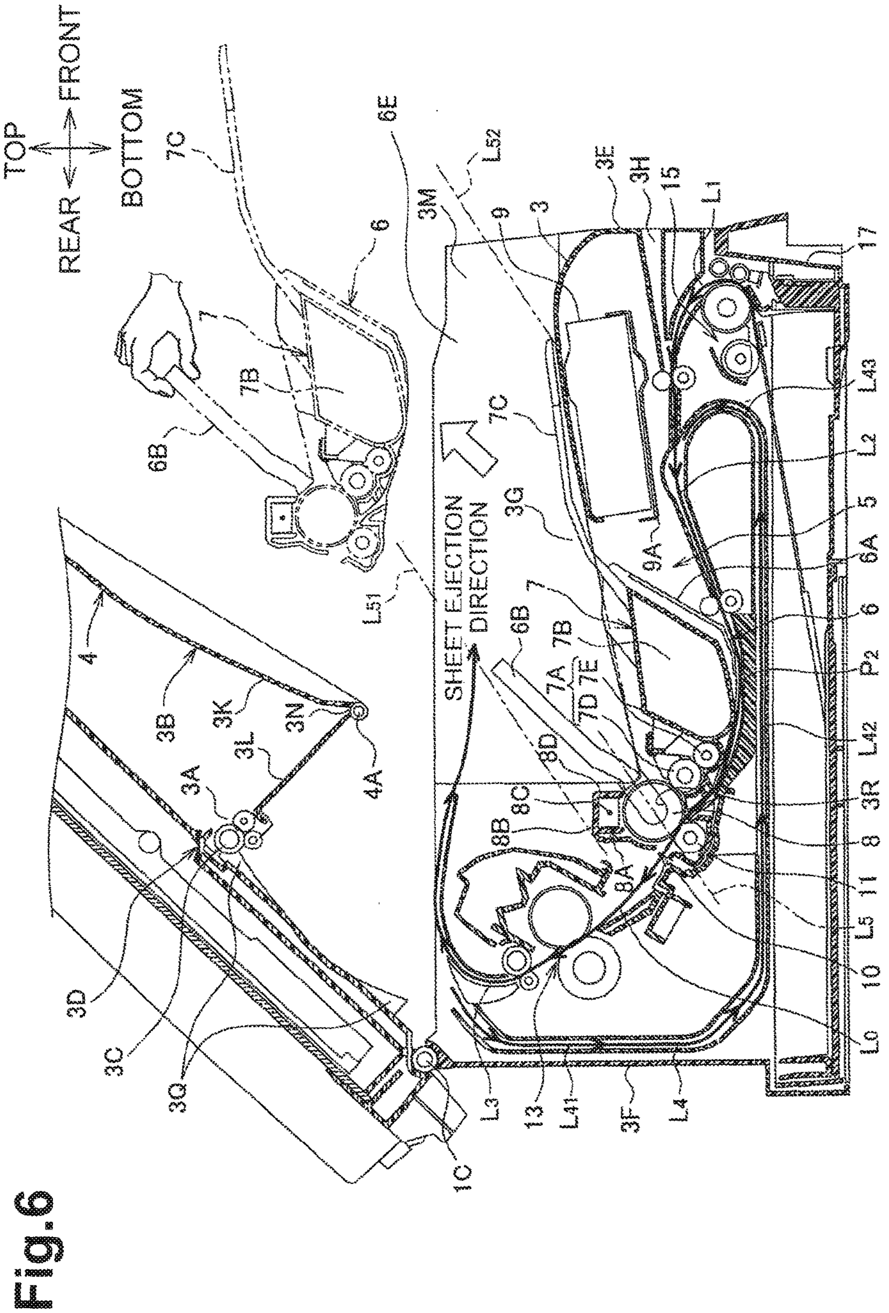
FIG. 6 is a sectional view of the image forming apparatus according to the first illustrative embodiment.

As illustrated in FIGS. 2 and 6, with the scanner 1B moved in the direction away from the opening 3G, the hinge portion 4A is located at an upward position away from the upper end of the side cover 3P. In the embodiment, with the scanner 1B moved in the direction away from the opening 3G, the hinge portion 4A is disposed in an area shifted from an area 6E for attaching or removing the image forming unit 6.

The area 6E for attaching or removing the image forming unit 6 is a band-shaped area, which extends parallel to an extending direction L5 in which a guide groove 3R extends, and is defined by an imaginary line L51 and an imaginary line L52. The imaginary line L51 passes through an end portion of the charger 8A close to the fixing unit 13 and extends parallel to the extending direction L5. The imaginary line L 52 passes through an end portion of the first grip portion 7C and extends parallel to the extending direction L5.

The guide groove 3R is a groove provided in the main body for positioning each end of the photosensitive drum 8 in a longitudinal direction thereof. In short, the photosensitive drum 8 is positioned relative to the main body when each end of the photosensitive drum 8 contacts the lower end of the guide groove 3R.

As illustrated in FIG. 1, a feeder mechanism 15 is disposed upstream of the image forming section 5 in the sheet conveying direction. The feeder mechanism 15 feeds sheets received in a sheet supply tray 17 one by one toward the image forming section 5. The sheet supply tray 17 is detachably attached to the main body below the image forming unit 6 in the vertical direction.

In the embodiment, the image forming unit 6 and the light exposure device 9 are disposed below the open/close cover 4 constituting the ejection tray 3B in the vertical direction and arranged in the order of the light exposure device 9 and the image forming unit 6 from the front side. Specifically, they are arranged in the order of the light exposure device 9, the storing portion 7B, the developing device 7A, the photosensitive drum 8, and the fixing unit 13 from the front side.

Figure 7:
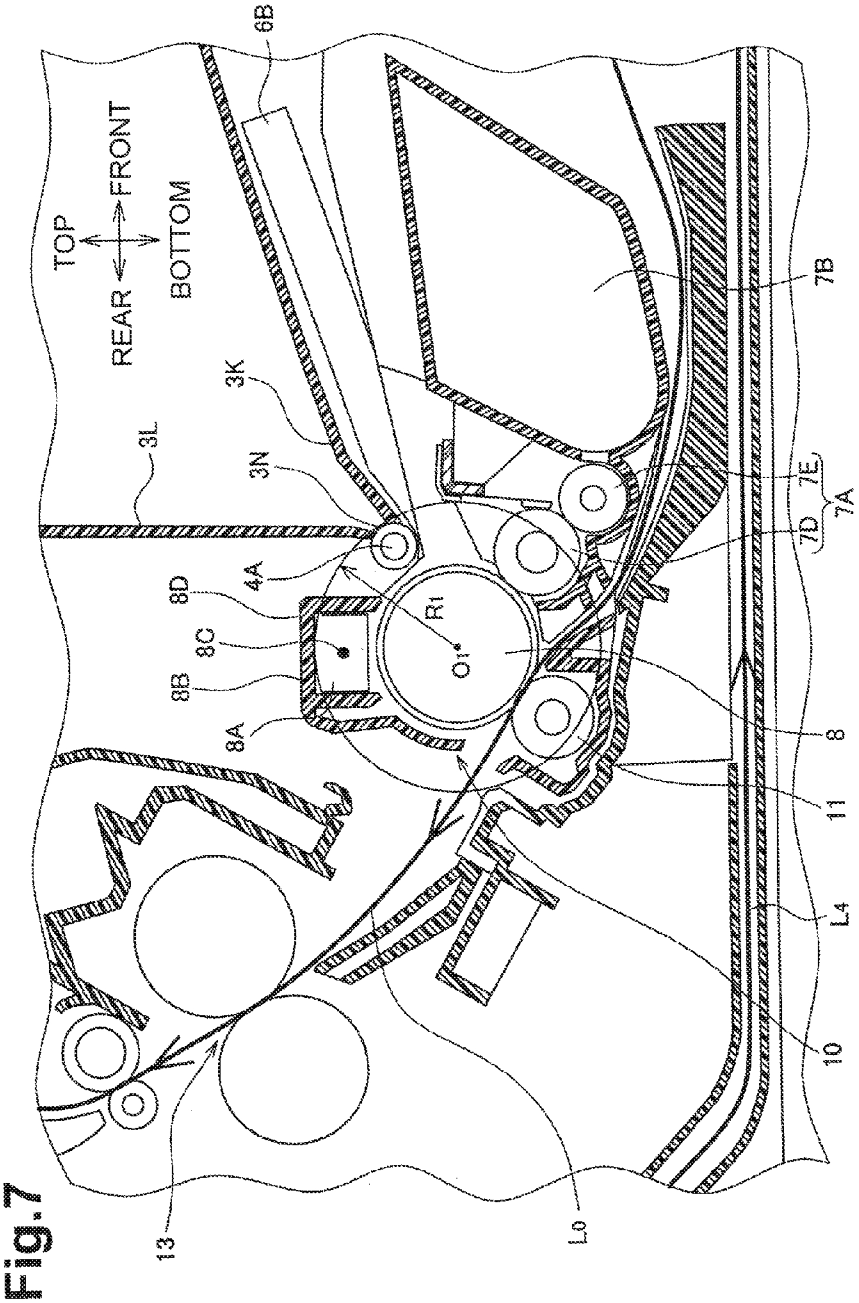
FIG. 7 is an enlarged view of a photosensitive drum and surroundings thereof.

As illustrated in FIG. 7, the charger 8A, the lowest end portion 3N of the sheet receiving surface 3K, and the developing device 7A are arranged in this order along a circumference of a circle having a radius R1 extending from an axis O1 of the photosensitive drum 8 to the upper end of the charger 8A.

As illustrated in FIG. 1, when a sheet conveying path L0 leading from the sheet supply tray 17 toward the ejection tray 3B is projected on an imaginary vertical plane parallel to the sheet ejection direction, the projected sheet conveying path L0 is curved in the shape of the letter S such that it bends at a portion below the light exposure device 9 and at a portion beyond the fixing unit 13 downstream of the photosensitive drum 8 in the sheet conveying direction.

Specifically, the sheet conveying path L0 passes across below the light exposure device 9 and the image forming unit 6 in the vertical direction and then leads to the fixing unit 13. The sheet conveying path L0 includes a first bend portion L1 disposed below the light exposure device 9. The first bend portion L1 is substantially U-shaped, extends upward from the sheet supply tray 17 in the vertical direction and bends about 180 degrees rearward.

The sheet conveying path L0 includes a portion L2 extending from the first bend portion L1 to the image forming unit 6. The portion L2 is inclined downward, relative to the horizontal direction, toward a downstream side in the sheet conveying direction.

When an end portion of the light exposure device 9 close to the storing unit 7 is referred to as a light exposure device end portion 9A, a position P1 in the sheet conveying path L0 is shifted downward from the light exposure device end portion 9A, and a position P2 in the sheet conveying path L0, which is shifted downward from the lowest end of the storing unit 7 in the vertical direction, is disposed below the position P1 in the vertical direction.

The sheet conveying path L0 is inclined upward, relative to the horizontal direction, from the position P2 via the transfer unit 11 toward the fixing unit 13. The sheet conveying path L0 includes a second bend portion L3. The second bend portion L3 is substantially U-shaped, extends upward from beyond the fixing unit 13 in the vertical direction, bends about 180 degrees frontward, and extends toward the ejection tray 3B.

A re-feed path L4 is provided for feeding a sheet having an image on one side again to the image forming section 5 in order to form an image on the other side of the sheet. A sheet having an image on one side is directed by the ejection roller 3C into the re-feed path L4 to be fed again to the image forming section 5. The re-feed path L4 includes a first portion L41, a second portion L42, and a third portion L3.

The first portion L41 is a path extending, behind the fixing unit 13, vertically toward a lower portion of the image forming unit 6. The second portion L42 is a path continuing from the first portion L41 and extending frontward below the image forming unit 6 and a part of the light exposure device 9. The third portion L43 is a path turning upward in the vertical direction from the second portion L42 and then extending rearward to the image forming section 5.

In the embodiment, as illustrated in FIG. 1, the lowest end portion 3N of the sheet receiving surface 3K is located below the upper end of the charger 8A in the vertical direction, and the charger 8A is disposed opposite to the developing device 7A relative to the lowest end portion 3N of the sheet receiving surface 3K.

As a space between the charger 8A and the developing device 7A is used for a part of the sheet receiving surface 3K, the need to increase the vertical dimension of the image forming apparatus 1 can be reduced while the stacking capacity on the ejection tray 3B is maintained.

As the lowest end portion 3N of the sheet receiving surface 3K is disposed between the charger 8A and the developing device 7A, the sheet receiving surface 3K and the vertical wall portion 3L can prevent the release of floating matter, such as developer in the developing device 7A, and additives contained in the developer, toward the charger 8A.

This structure can reduce a possibility that the floating matter adheres to the charger 8A. Thus, improper charging of the photosensitive drum 8 can be minimized, and improper image formation can be also minimized.

In the embodiment, when the top cover 3D is moved in the direction away from the opening 3G and located in the open position, the guide portion 3Q is simultaneously released. A sheet jammed near the second bend portion L3 can be exposed by opening the top cover 3D. Thus, sheet jamming can be easily cleared.

In the embodiment, when the scanner 1B is moved in the direction away from the opening 3G, the hinge portion 4A is located at an upper position away from the upper end of the side cover 3P in the vertical direction. This allows the user to visually identify the entire of the image forming unit 6 through the opening 3G. For example, operation to remove a sheet jammed near the image forming unit 6 and operation to attach or remove the image forming unit 6 can be improved.

In the embodiment, when the scanner 1B is moved in the direction away from the opening 3G, the hinge portion 4A is disposed in an area shifted from the area 6E for attaching or removing the image forming unit 6. As the hinge portion 4A is kept out of the way of attachment and removal of the image forming unit 6, the image forming unit 6 can be easily attached to or removed from the main body.

A second embodiment will be described.

Figure 5B:
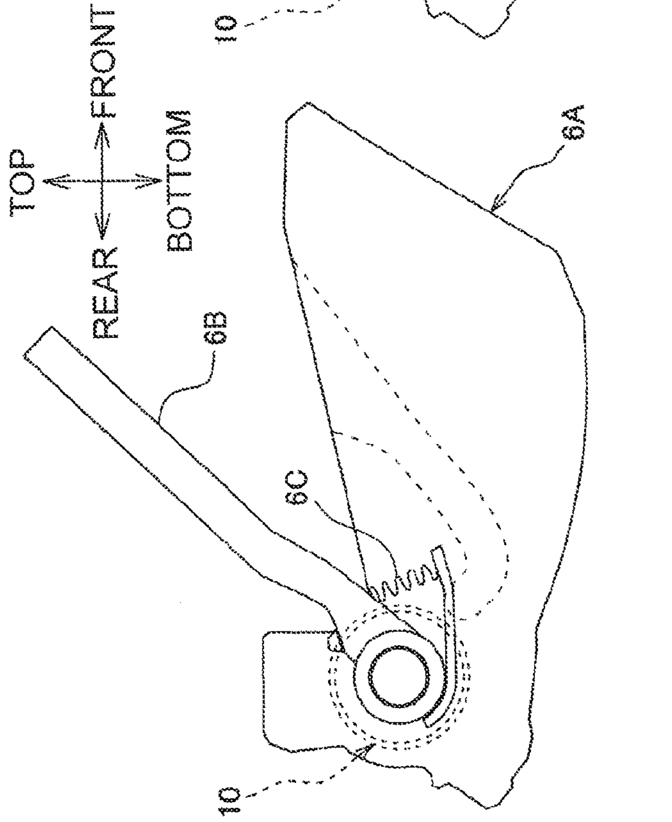
FIG. 5B illustrates the support body according to the first illustrative embodiment.
Figure 8A:
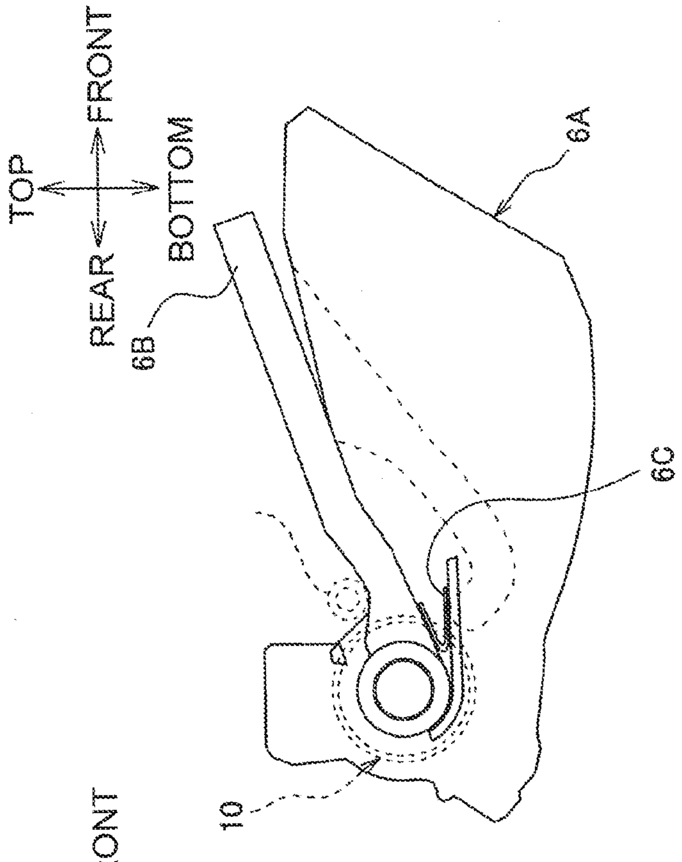
FIG. 8A illustrates the support body according to a second illustrative embodiment.
Figure 8B:
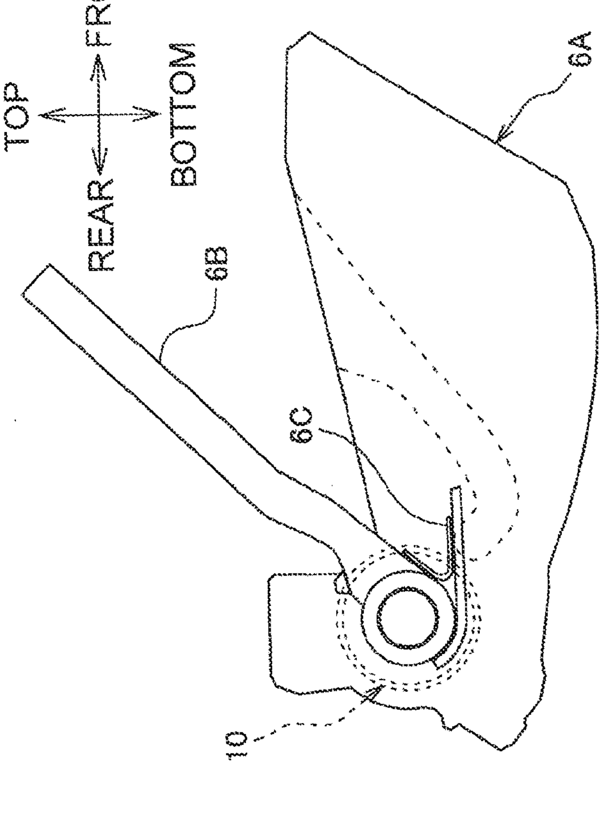
FIG. 8B illustrates the support body according to the second illustrative embodiment.

An elastic member 6C according to the second embodiment is a plate spring as illustrated in FIGS. 8A and 8B, while the elastic member 6C according to the first embodiment is a coil spring as illustrated in FIG. 5B while. The elastic member 6C illustrated in FIGS. 8A and 8B may be any elastic member other than the coil spring according to the first embodiment, such as a helical torsion spring.

A third embodiment will be described.

Figure 9:
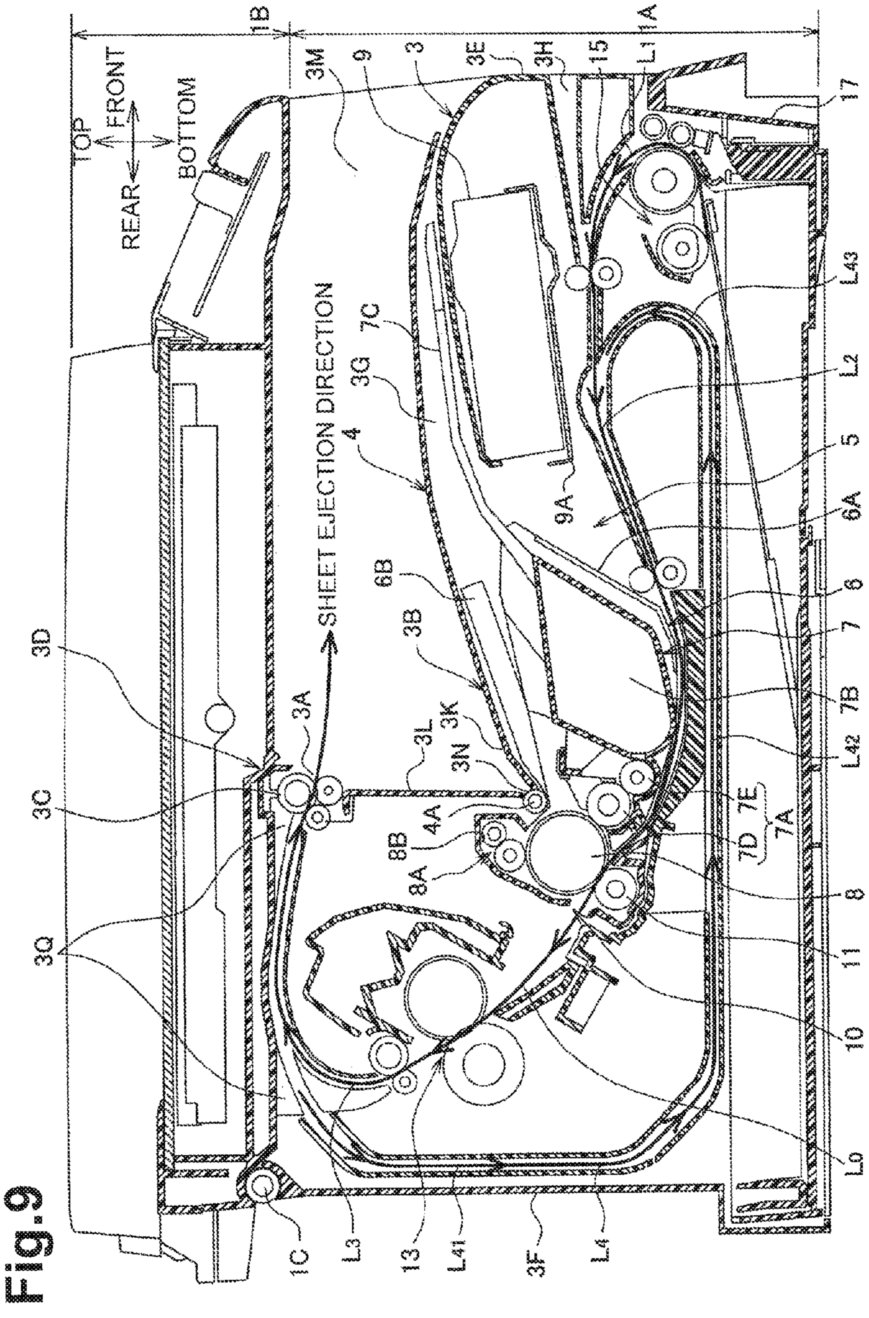
FIG. 9 a sectional view of an image forming apparatus according to a third illustrative embodiment.

A charger 8A according to the third embodiment uses a charging roller as illustrated in FIG. 9, while the charger 8A according to the first embodiment is a scorotron charger in which corona discharge is generated from a charging wire 8C made of tungsten. In the third embodiment, the upper end of the charger 8A is an upper end of a charging cleaning roller contacting the charging roller from above in the vertical direction.

The above embodiment shows, but is not limited to, the open/close cover 4 constituting a part of the ejection tray 3B.

The above embodiment shows, but is not limited to, that the scanner 1B being disposed above the printer 1A in the vertical direction. The scanner 1B may be omitted.

The disclosure may combine at least two of the first to third embodiments.

While the features herein have been described in connection with various example structures and illustrative aspects, it will be understood by those skilled in the art that other variations and modifications of the structures and aspects described above may be made without departing from the scope of the inventions described herein. Other structures and aspects will be apparent to those skilled in the art from a consideration of the specification or practice of the features disclosed herein. It is intended that the specification and the described examples only are illustrative with the true scope of the inventions being defined by the following claims.

What is claimed is:

1. An image forming apparatus configured to form an image on a sheet, the image forming apparatus comprising:

a main body having an opening;

a cover movable between a closed position in which the opening of the main body is closed and an open position in which the opening of the main body is open, the cover having an upper surface configured to receive a sheet having an image thereon;

a support body disposed in the main body below the cover and configured to be attached to and removed from the main body through the opening when the cover is in the open position, the support body including:

a photosensitive drum configured to rotate about an axis and carry a developer image to be transferred onto a sheet;

a charger configured to charge the photosensitive drum; and a support-body grip portion;

a light exposure device disposed in a front portion of the main body below the cover and spaced apart from the photosensitive drum, the light exposure device being configured to expose the photosensitive drum to light by scanning;

a storing unit configured to be attached to and removed from the main body through the opening when the cover is in the open position, the storing unit including:

a storing portion configured to store developer therein;

a developing device configured to supply developer stored in the storing portion to the photosensitive drum exposed by the light exposure device; and a storing-unit grip portion protruding toward the front portion of the main body when the storing unit is attached to the main body, wherein, when the storing unit and the support body are attached to the main body, the storing unit is disposed between the photosensitive drum and the light exposure device in the main body below the cover; and an ejection roller disposed above the support body when the support body is attached to the main body and configured to eject the sheet to the upper surface of the cover in a sheet ejection direction from a rear portion of the main body toward the front portion of the main body, wherein, when the support body is attached to the main body, the upper surface of the cover is inclined downward toward the photosensitive drum to a lowest end portion located at an upstream end of the upper surface in the sheet ejection direction, and wherein, when the support body is attached to the main body, the lowest end portion of the upper surface is located, in the sheet ejection direction, between the light exposure device and the axis of the photosensitive drum and closer to the axis of the photosensitive drum than to the light exposure device, and a furthest portion of the support-body grip portion in the sheet ejection direction is located between the lowest end portion of the upper surface and the light exposure device.

2. The image forming apparatus according to claim 1, wherein, when the support body and the storing unit are attached to the main body, the storing-unit grip portion is closer to the light exposure device than the support-body grip portion in the sheet ejection direction.

3. The image forming apparatus according to claim 1, wherein, when the support body and the storing unit are attached to the main body, the storing-unit grip portion extends above the light exposure device.

4. The image forming apparatus according to claim 1, wherein, when the support body is attached to the main body, the support-body grip portion is pivotable relative to an axis of the support body between a first position and a second position.

5. The image forming apparatus according to claim 1, wherein the cover is configured to pivot about an axis located closer to the photosensitive drum in the support body than the light exposure device.

6. The image forming apparatus according to claim 1, wherein the cover comprises:

a wall surface located below the ejection roller and extending to the lowest end portion of the upper surface of the cover;

a first sidewall surface provided on a first side of the upper surface of the cover in a width direction perpendicular to the sheet ejection direction; and a second sidewall surface provided on a second side of the upper surface of the cover opposite to the first side in the width direction.

7. The image forming apparatus according to claim 1, wherein the support body further includes a transfer device facing the photosensitive drum and configured to transfer the developer image on the photosensitive drum to the sheet.

8. The image forming apparatus according to claim 1, wherein the support body is configured to support the storing unit, the storing unit being detachable from the support body.

9. The image forming apparatus according to claim 1, wherein the lowest end portion of the upper surface of the cover is located below the charger.

10. The image forming apparatus according to claim 1, wherein the charger includes a charging roller.

* * * * *